(12) United States Patent
Aurola (10) Patent No.: US 8,148,760 B2
(45) Date of Patent: Apr. 3, 2012

(54) VISIBLE LIGHT DETECTING SEMICONDUCTOR RADIATION DETECTOR

(76) Inventor: Artto Aurola, Espoo (FI)

( * ) Notice: Subject to any disclaimer, the term of this patent is extended or adjusted under 35 U.S.C. 154(b) by 943 days.

(21) Appl. No.: 12/087,380

(22) PCT Filed: Dec. 29, 2006

(86) PCT No.: PCT/FI2006/000428
§ 371 (c)(1),
(2), (4) Date: Jul. 2, 2008

(87) PCT Pub. No.: WO2007/077292
PCT Pub. Date: Jul. 12, 2007

(65) Prior Publication Data
US 2009/0001435 A1    Jan. 1, 2009

(30) Foreign Application Priority Data

Jan. 5, 2006  (WO) .................. PCT/FI2006/000009
Feb. 17, 2006  (WO) .................. PCT/FI2006/000058
Apr. 21, 2006  (FI) ....................................... 20060388

(51) Int. Cl.
*H01L 31/062* (2006.01)
(52) U.S. Cl. ...................................................... 257/292
(58) Field of Classification Search .................. 257/292, 257/E27.133
See application file for complete search history.

(56) References Cited

U.S. PATENT DOCUMENTS

| | | | | |
|---|---|---|---|---|
| 6,232,626 B1* | 5/2001 | Rhodes | .......................... | 257/292 |
| 7,132,705 B2* | 11/2006 | Kuwazawa | .................... | 257/292 |
| 7,253,461 B2* | 8/2007 | Yang et al. | ..................... | 257/292 |
| 2001/0042875 A1* | 11/2001 | Yoshida | ......................... | 257/291 |
| 2006/0071254 A1* | 4/2006 | Rhodes | .......................... | 257/292 |
| 2006/0076587 A1* | 4/2006 | Hirai et al. | ..................... | 257/291 |
| 2008/0315265 A1* | 12/2008 | Aurola | ........................... | 257/257 |

FOREIGN PATENT DOCUMENTS

WO    WO 2006018477 A1 *    2/2006

* cited by examiner

*Primary Examiner* — Wael Fahmy
*Assistant Examiner* — Sarah Salerno
(74) *Attorney, Agent, or Firm* — Wood, Phillips, Katz, Clark & Mortimer (57) ABSTRACT

A semiconductor radiation detector device, comprising a bulk layer (103) of semiconductor material, and on the first surface of the bulk layer (303) in the following order: a modified internal gate layer (104) of semiconductor material of second conductivity type, a barrier layer (305) of semiconductor material of first conductivity type and pixel dopings (131, 132, 133) of semiconductor material of the second conductivity type, adapted to be coupled to at least one pixel voltage in order to create pixels corresponding to pixel dopings, characterized in that the device comprises a first contact of first conductivity type and said pixel voltage is defined as the potential difference between the pixel doping and the first contact.

16 Claims, 13 Drawing Sheets

VISIBLE LIGHT DETECTING SEMICONDUCTOR RADIATION DETECTOR

FIELD OF THE INVENTION

The invention is related to semiconductor radiation detectors and particularly to a semiconductor radiation detector having a modified internal gate.

BACKGROUND OF THE INVENTION

Radiation is converted to electron hole pairs in semiconductor material. In semiconductor radiation detectors the electron hole pairs are separated by an electric field. The measured charge type is referred to as signal charge and the opposite charge type is referred to as secondary charge.

The patent applications WO 2006/018470 A1, WO 2006/018477 A1, PCT/FI2006/000009 and PCT/FI2006/000058 which are included herein by reference disclose a semiconductor radiation detector having a modified internal gate (MIG). The MIG detector presented in the patent applications WO 2006/018470 A1, WO 2006/018477 A1 is optimized for the detection of low energy X-rays and for particle and near infra-red radiation in case the semiconductor material is silicon. The MIG detector presented in the last two applications is optimized for the detection of visible light in low light level circumstances in case the semiconductor material is silicon. The MIG detectors are comprised of a bulk layer, of a MIG layer of the second conductivity type on top of the bulk layer, of a barrier layer of the first conductivity type on top of the MIG layer and of pixel dopings of the second conductivity type on top of the barrier layer. There may be also channel stop dopings of the first conductivity type on top of the barrier layer. The MIG detectors enable non-destructive reading of the signal charge, isolation between the signal charges and the surface generated charges and it has a low capacitance. For these reasons the MIG structure provides the best possible detection sensitivity of all semiconductor radiation detectors.

The problem associated with the MIG detectors is, however, a low dynamic range. This is due to the low full well capacity of the MIG. The row reset or the rolling shutter mechanism provides an equal integration time for each pixel which improves the image quality especially if a short integration time is used. The MIG detectors of PCT/FI2006/000009 and PCT/FI2006/000058 comprise an additional clear contact (e.g. 1334 in PCT/FI2006/000058) of the second conductivity type, which can be used also as an anti blooming drain, and a clear gate (e.g. 1343 in PCT/FI2006/000058) controlling the flow of signal charges from the MIG layer to the clear contact. This arrangement enables row reset since the clear gates of a row of pixels can be interconnected and a reset signal can be provided to the interconnected row of gates. The afore mentioned arrangement enables actually individual reset of pixels since the pixel doping (e.g. 1333 in PCT/FI2006/000058) closest to the clear gate can function also as an additional clear gate beside being a drain. This requires that these pixel dopings are connected for instance row wise in the pixel matrix and that the clear gates are connected column wise in the pixel matrix. The problem with the individual reset arrangement is that a large current may run between the drain and the clear contact during the reset operation which enhances the power consumption of the device.

A problem of the row reset related especially to still images is that images of fast moving objects are blurred since the start and the end points of the integration period are different in different rows although the integration time is the same.

BRIEF DESCRIPTION OF THE INVENTION

An objective of the invention is to provide a MIG detector with an improved dynamic range. Another objective of the invention is to provide a global electronic shutter for the MIG detector presented in PCT/FI2006/000009 and PCT/FI2006/000058 enabling the start and end times of the integration period to be the same for all pixels of the detector. Another objective of the invention is to provide row reset for the MIG detector presented in WO 2006/018470 A1 and WO 2006/018477 A1. Yet another objective of the invention is to provide for the MIG detector presented in PCT/FI2006/000009 and PCT/FI2006/000058 individual reset for the pixels with reduced power consumption.

The objectives of the invention are achieved by a semiconductor radiation detector of claim 1, comprising a bulk layer of semiconductor material, and on the first surface of the bulk layer in the following order: a modified internal gate layer of semiconductor material of second conductivity type, a barrier layer of semiconductor material of first conductivity type and pixel dopings of semiconductor material of the second conductivity type, adapted to be coupled to at least one pixel voltage in order to create pixels corresponding to pixel dopings, characterised in that the device comprises a first conductivity type first contact said pixel voltage being defined as a potential difference between the pixel doping and the first contact.

The dynamic range of the MIG detector can be improved by interconnecting a clear contact which functions also as an anti blooming drain to an additional electronic circuitry. The signal charge is first read for instance with a double MIGFET (MIG Field Effect Transistor) presented in WO 2006/018470 A1, WO 2006/018477 A1, PCT/FI2006/000009 and PCT/FI2006/000058. After this the signal charge is transferred to the clear contact by applying a signal to a clear gate and the charge is read again using the additional electronic circuitry. If the measured amount of signal charge exceeds a certain limit the result obtained from the additional electronic circuitry is used and if the signal charge does not exceed the limit the result is obtained from the double MIGFET.

The global electronic shutter can be provided for the MIG detector by introducing on the semiconductor chip a separate light to signal charge conversion area, which is not covered by an opaque layer. From the light to signal charge conversion area the signal charges are guided to the MIG layer where the flow of the signal charges can be controlled by two global shutter gates. The first global shutter gate controls the flow of the signal charges to e.g. a double MIGFET and the second global shutter gate controls the flow of the signal charge to a clear contact. During the signal charge integration period the first global shutter gate is open and the second global shutter gate is closed. On the other hand, during the signal charge read out period the first global shutter gate is closed and the second shutter gate is open. In this fashion the start and the end of the signal charge integration period can be the same for all pixels in the pixel matrix.

The rolling shutter mechanism can be introduced to the MIG detector presented in the patent applications WO 2006/018470 A1 and WO 2006/018477 A1 by providing for each pixel individual channel stop dopings which are separated from the channel stop dopings of the neighbouring pixels. In this manner the pixels can be reset row wise. The separation of the channel stop dopings can be obtained for instance by providing a separation doping of the second conductivity type between the individual channel stop dopings. When a proper reverse bias is applied between the channel stop dopings and the separation dopings the channel stop dopings of adjacent pixels can be at different potentials during reset, which enables row reset. Another possibility to provide row reset for the MIG detector presented in the patent applications WO 2006/018470 A1 and WO 2006/018477 A1 is to isolate the pixels completely from each others using for instance SOI (Silicon On Insulator) technology.

The individual reset of the pixels in the MIG detectors presented by the patent applications in PCT/FI2006/000009 and PCT/FI2006/000058 can be performed by using instead of a single MOS (Metal Oxide Semiconductor) clear gate two separate MOS clear gates. The first of the MOS clear gates is connected row wise to first clear gates in the pixel matrix and the second clear gate is connected column wise to the second clear gates in the pixel matrix.

DETAILED DESCRIPTION OF THE INVENTION

Figure 1:
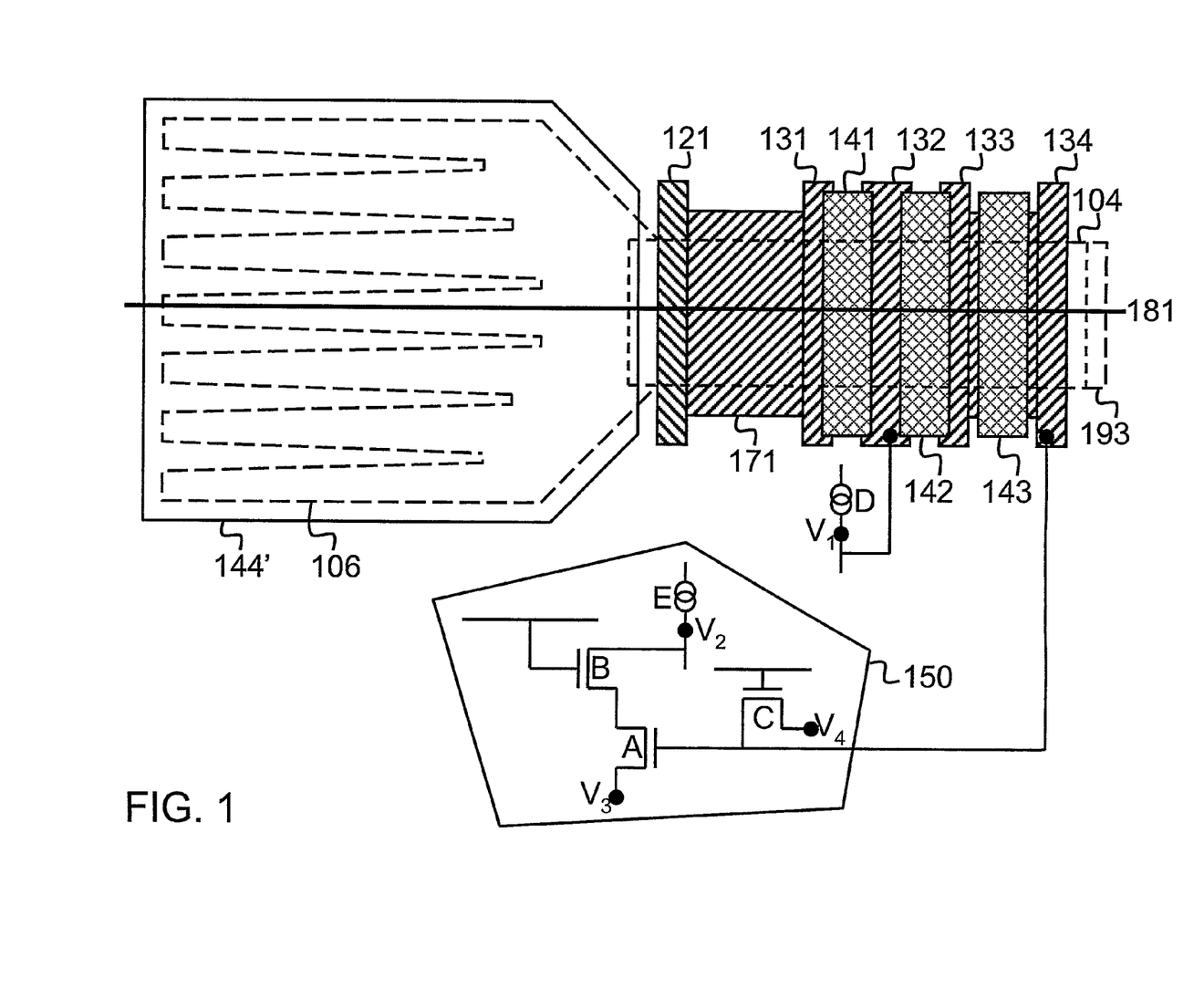
FIG. 1 illustrates an embodiment of the invention, where the clear contact is connected to an additional read out circuitry in order to improve the dynamic range.

FIG. 1 illustrates an embodiment of the semiconductor radiation detector according to the invention. The detector comprises a light to signal charge conversion area 144' which is not covered by an opaque layer. The light to signal charge conversion area further includes a buried doping 106 of the second conductivity which is connected to a MIG layer 104 on the edge of the light to signal charge conversion area. The signal charges created in the light to signal charge conversion area flow from the buried doping 106 to the MIG layer 104. Between a channel stop doping 121 of the first conductivity type and a pixel doping 131 of the second conductivity type is a surface doping 171 of the second type, which is already introduced in the patent applications PCT/FI2006/000009 and PCT/FI2006/000058. The surface doping 171 is during operation preferably fully depleted. The pixel dopings 131 and 133 of the second conductivity type are preferably drain dopings and the pixel doping 132 of the second conductivity type is preferably a source doping of a double MIGFET. Between the source and drain dopings are the gates 141 and 142 of the double MIGFET. The clear gate 143 controls the flow of the signal charges from the MIG layer 104 to the clear contact 134 of the second conductivity type through a second type doping 193 situated between the MIG layer and the clear contact. The doping 193 is already introduced in PCT/FI2006/000009 and PCT/FI2006/000058 and it is preferably formed of the same implant which is used to form the buried doping 106.

The source 132 is connected to a constant current source D. The amount of signal charge in the MIG can be deduced from the voltage V1. The full well capacity of the MIG is, however, limited and thus the clear contact 134 is connected to an additional electronic circuitry 150. The signal charge is first read by the double MIGFET multiple times after which it is transferred to the clear contact. Then the signal charge is read again using the additional electronic circuitry. If the amount of signal charge in one or both measurements exceeds a certain limit the measurement result obtained by the additional electronic circuitry is used and if the amount of signal charge is lower than this limit the measurement result obtained by the double MIGFET is used.

The additional electronic circuitry 150 presented in FIG. 1 represents one possible configuration. This configuration is comprised of three transistors A, B and C which belong to one pixel and of a current source E. The potential V2 is used to determine the amount of signal charge transferred to the clear contact. The transistor A is used to measure the signal charge, the transistor B is a selection transistor and the transistor C is a reset transistor. The potentials V3 and V4 are constant. It is important to note that any kind of electronic circuitry applied for measuring the amount of signal charge can be used as the additional electronic circuitry, i.e. the additional electronic circuitry 150 in FIG. 1 comprising the three transistors A, B and C is just an example. For instance one can use an electronic circuitry having a linear response region and a logarithmic response region. In this fashion the dynamic range of the MIG detector can be improved enormously. One can also use controlled double sampling technique to reduce the read out noise in the electronic circuitry 150.

Figure 3:
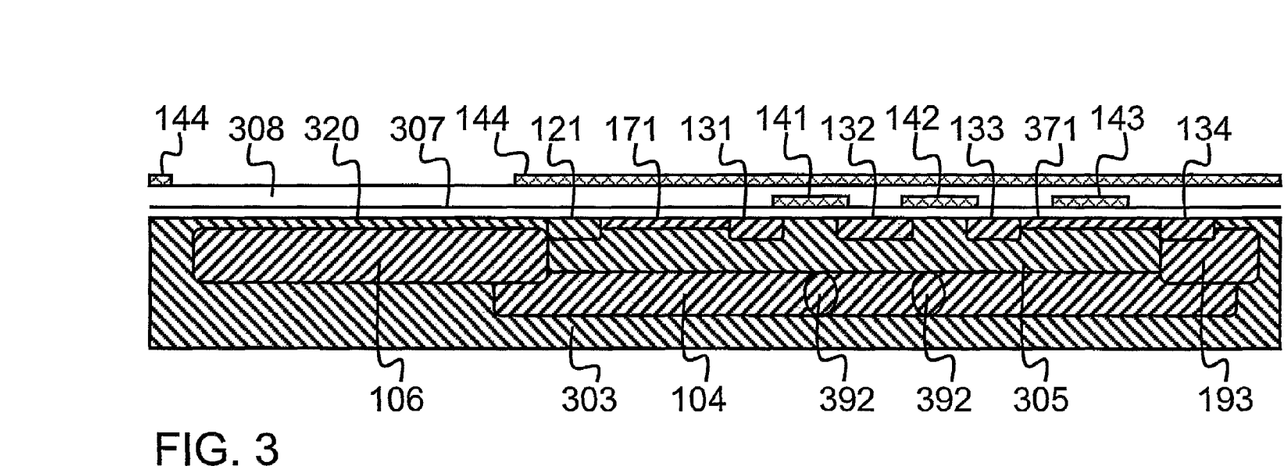
FIG. 3 illustrates a cross-section of the device presented in FIG. 1.

The cut line 181 corresponds to the cross-section presented by FIG. 3. Between the isolator layer 307 and the buried doping 106 is a first conductivity type extension 320 of the channel stop doping. It should be noted that contact vias are etched through the isolator layer 307. On top of a second isolator layer 308 is an opaque layer 144. Above the MIG layer is the barrier layer 305 and below the MIG layer is the bulk layer 303. Between the drain 133 and the clear contact 134 is an optional surface doping 371. In FIG. 3 the enhancements of the MIG layer dopings 392 of the second conductivity type extend from a location below the edge of the source doping to a location that is under the channel of the MIGFET, i.e. the enhancement of the MIG layer doping does not extend to a location that is below the edge of the drain doping.

Figure 2:
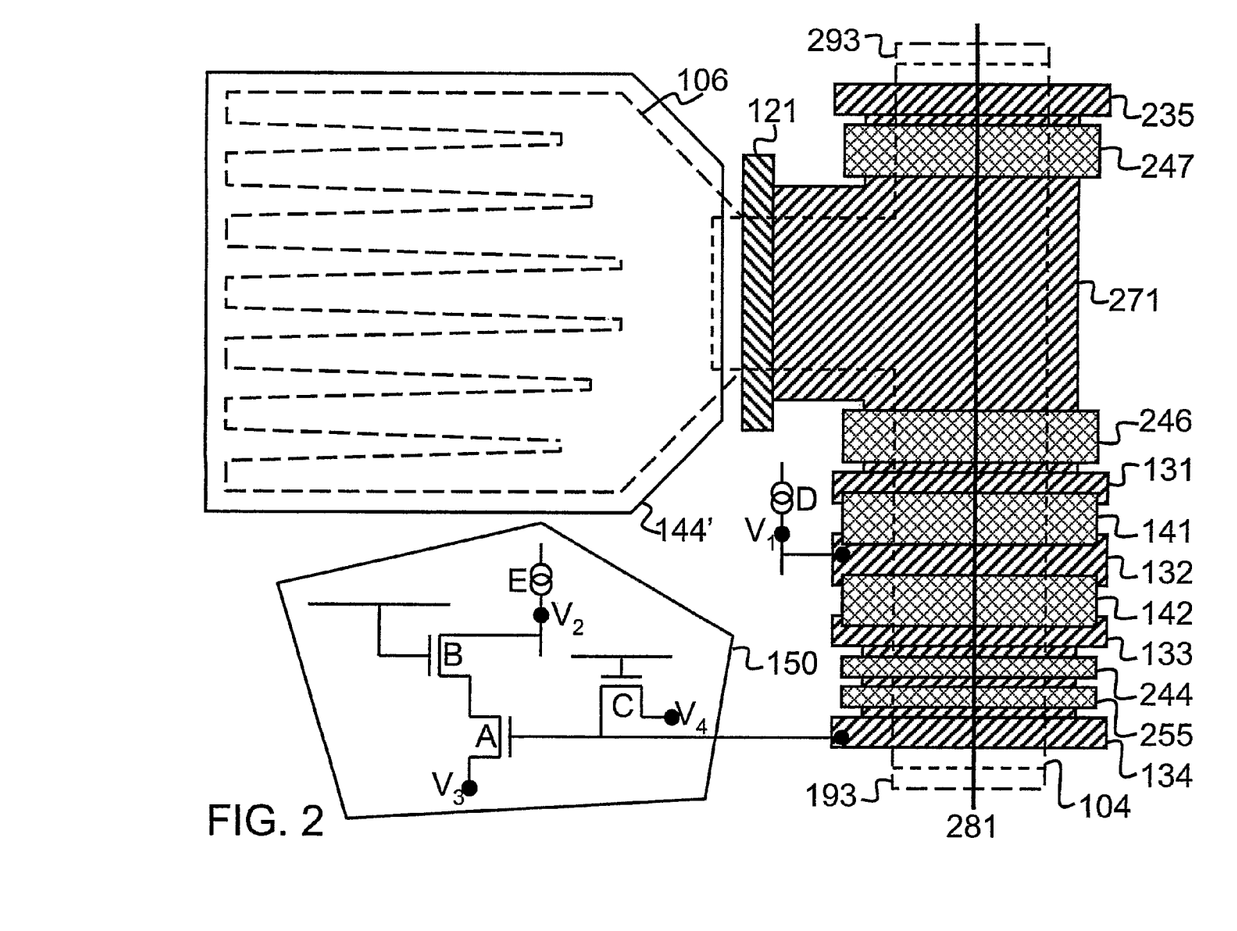
FIG. 2 illustrates an embodiment of the invention, where two global shutter gates are added to the structure of FIG. 1 in order to enable the start and the end times of an integration period to be the same for each pixel in the pixel matrix.

FIG. 2 illustrates another embodiment of the invention. The second global shutter gate 247 controls the flow of signal charges from the MIG layer 104 to an additional clear contact 235 of the second conductivity type through a doping 293 of the second conductivity type. The first global shutter gate controls the flow of signal charges from the MIG layer 104 to the enhancements of the MIG layer doping 392 of the double MIGFET. During the signal charge integration period the first global shutter gate is open and the second global shutter gate is closed. On the other hand, during the signal charge read out period the first global shutter gate is closed and the second shutter gate is open. In this fashion the start and the end of the signal charge integration period can be the same for all pixels in the pixel matrix.

Figure 4:
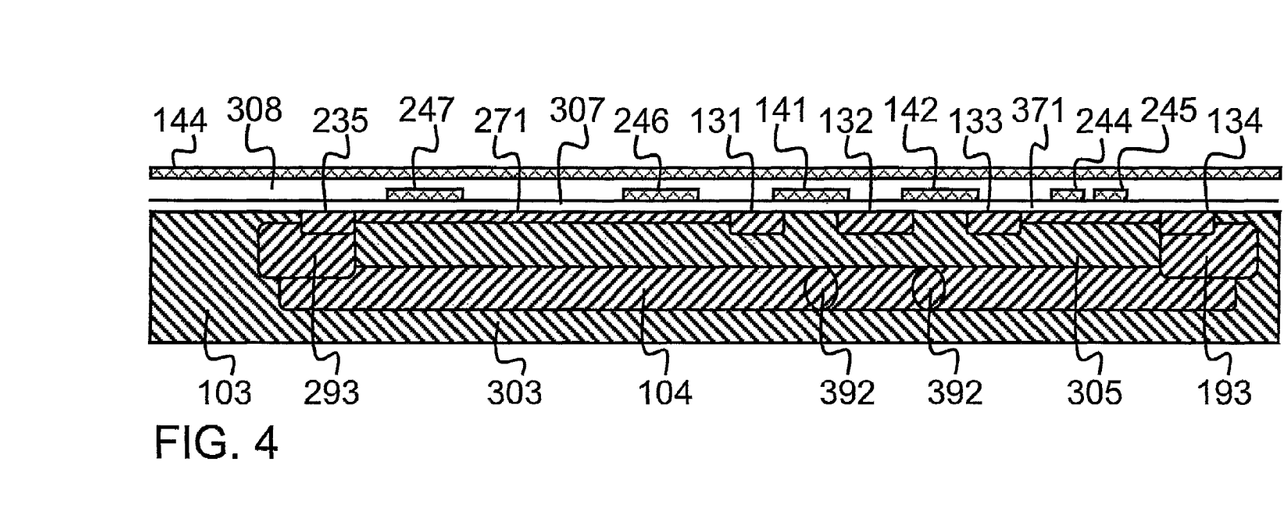
FIG. 4 illustrates a cross-section of the device presented in FIG. 2.

In the detector of FIG. 2 the MOS clear gate is split into two separate clear gates, i.e. there is a first clear gate 244 and a second clear gate 245. The first of the MOS clear gates is connected row wise to first clear gates in the pixel matrix and the second clear gate is connected column wise to the second clear gates in the pixel matrix. The power consumption of the individual pixel reset is very small in this configuration. The cut line 281 corresponds to the cross-section presented by FIG. 4.

Figure 5:
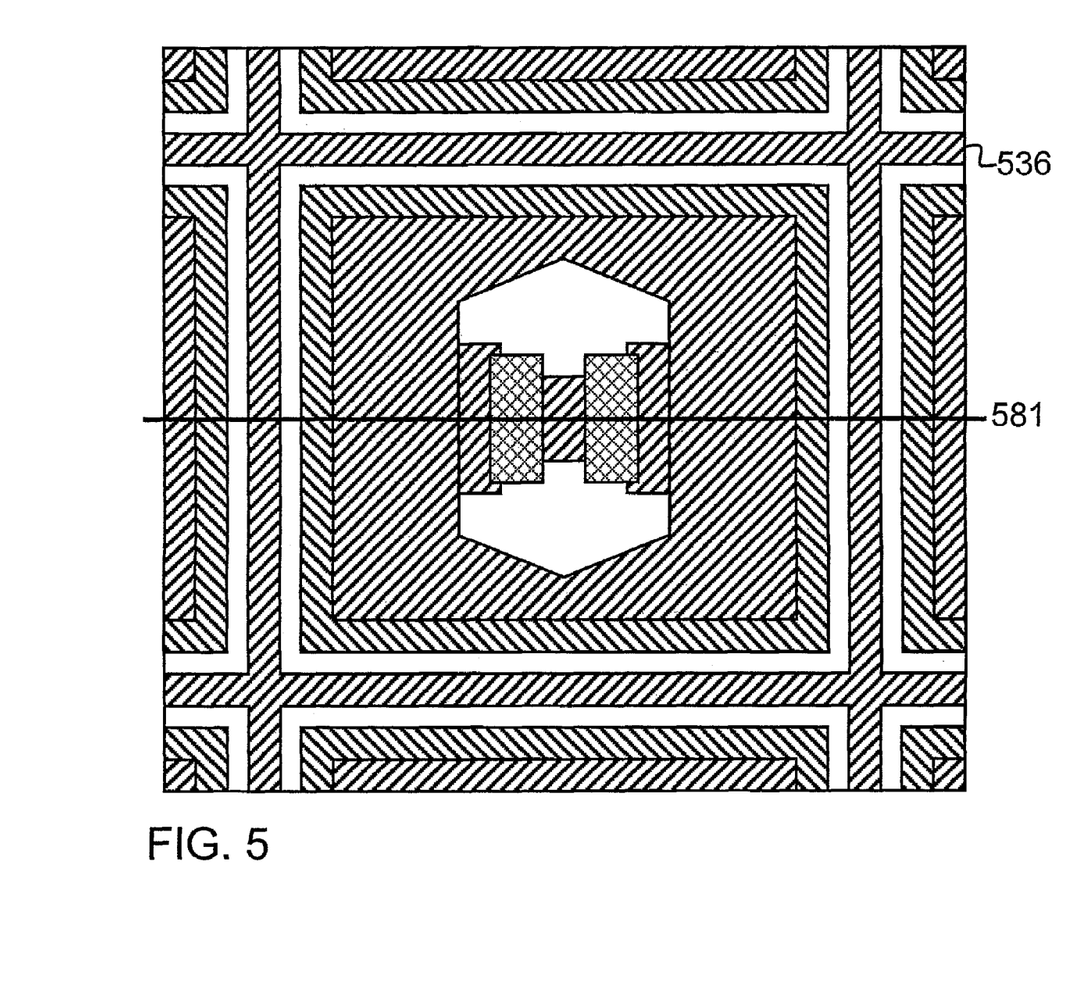
FIG. 5 illustrates an embodiment of the invention, where the channel stop dopings are separated from the channel stop dopings of the neighbouring pixels.
Figure 6A:
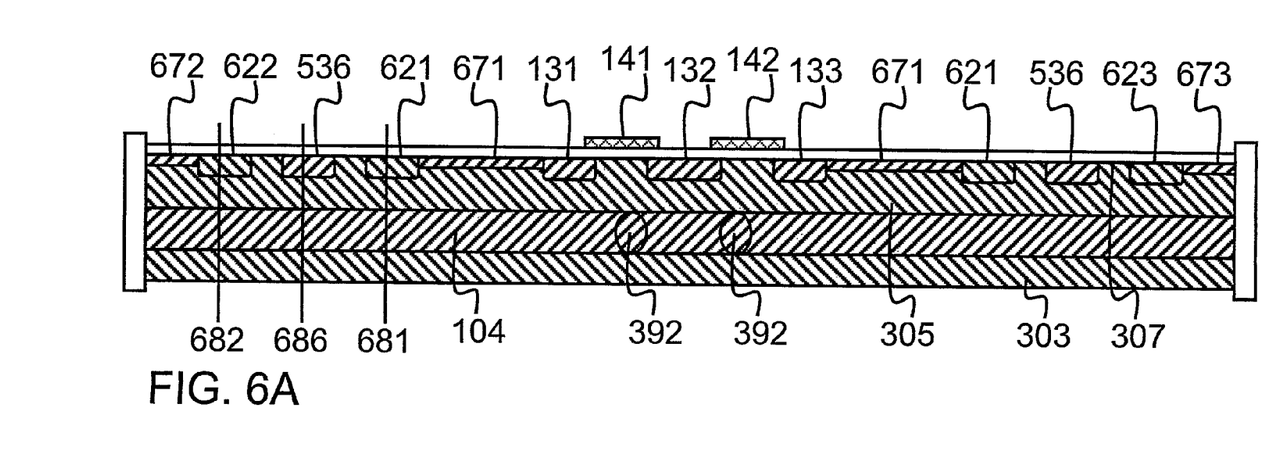
FIG. 6A illustrates a cross-section of the device presented in FIG. 5.
Figure 6B:
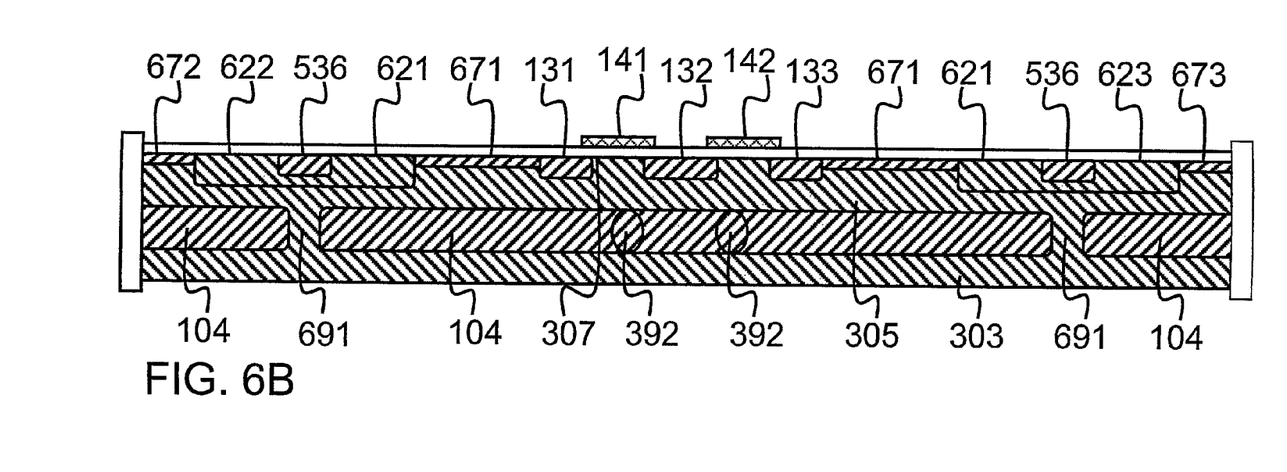
FIG. 6B illustrates an alternative cross-section of the device presented in FIG. 5.

FIG. 5 illustrates another embodiment of the invention enabling row reset for the MIG detectors described in the patent applications WO 2006/018470 A1 and WO 2006/018477 A1. The cut line 581 corresponds either to the cross-section presented in FIG. 6A or to the cross-section presented in FIG. 6B. The separation doping 536 of the second conductivity type separates the channel stop dopings 621, 622 and 623 of different pixels. The second conductivity type surface dopings 671, 672 and 673 belong to different pixels and they are preferably fully depleted during operation. In the device of FIG. 6B the MIG layer 104 has gaps 691. In the MIG detectors of FIGS. 1 and 2 the blooming current is collected by the clear contacts and in the MIG detector of FIG. 5 the blooming current is collected by the drain dopings 131, 133. One should note that part of the separation doping can also be replaced by a MOS structure. In this case the MOS gate is preferably connected to the separation doping.

Figure 7A:
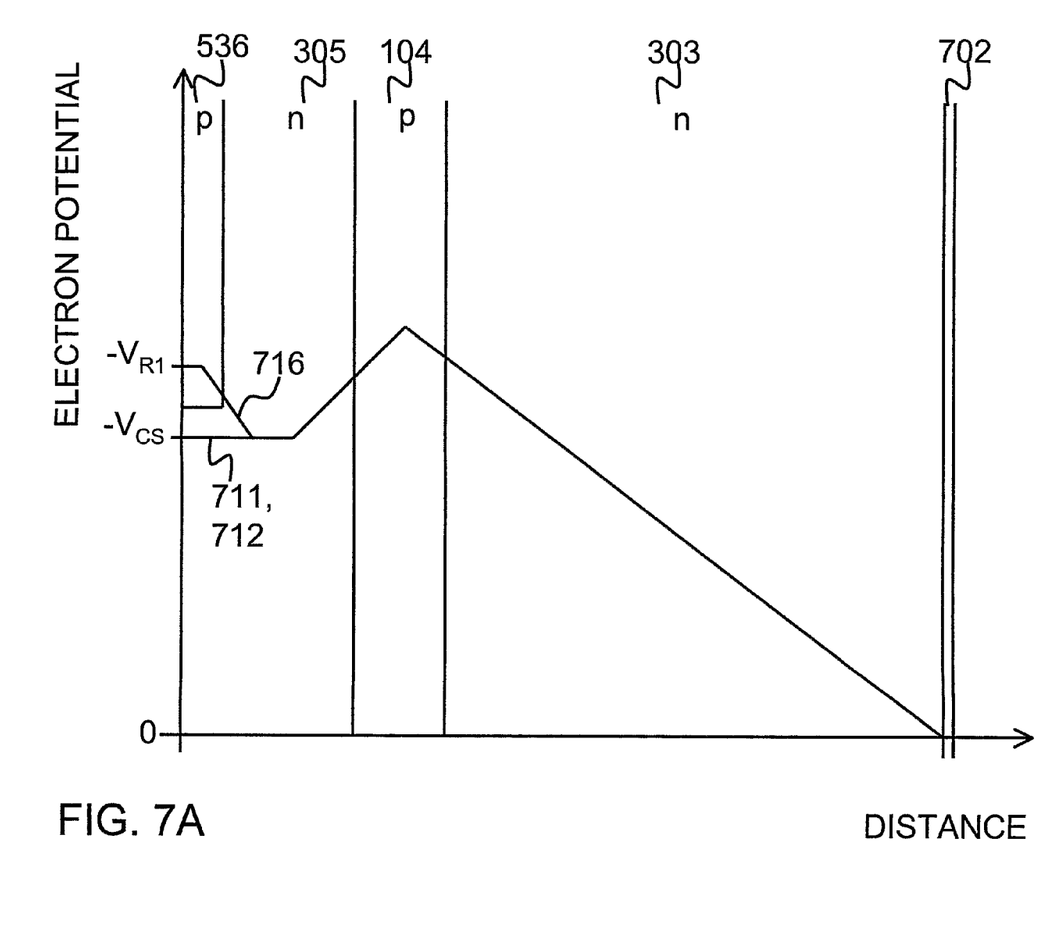
FIG. 7A illustrates electron potentials of the device presented in FIG. 6A during integration.
Figure 7B:
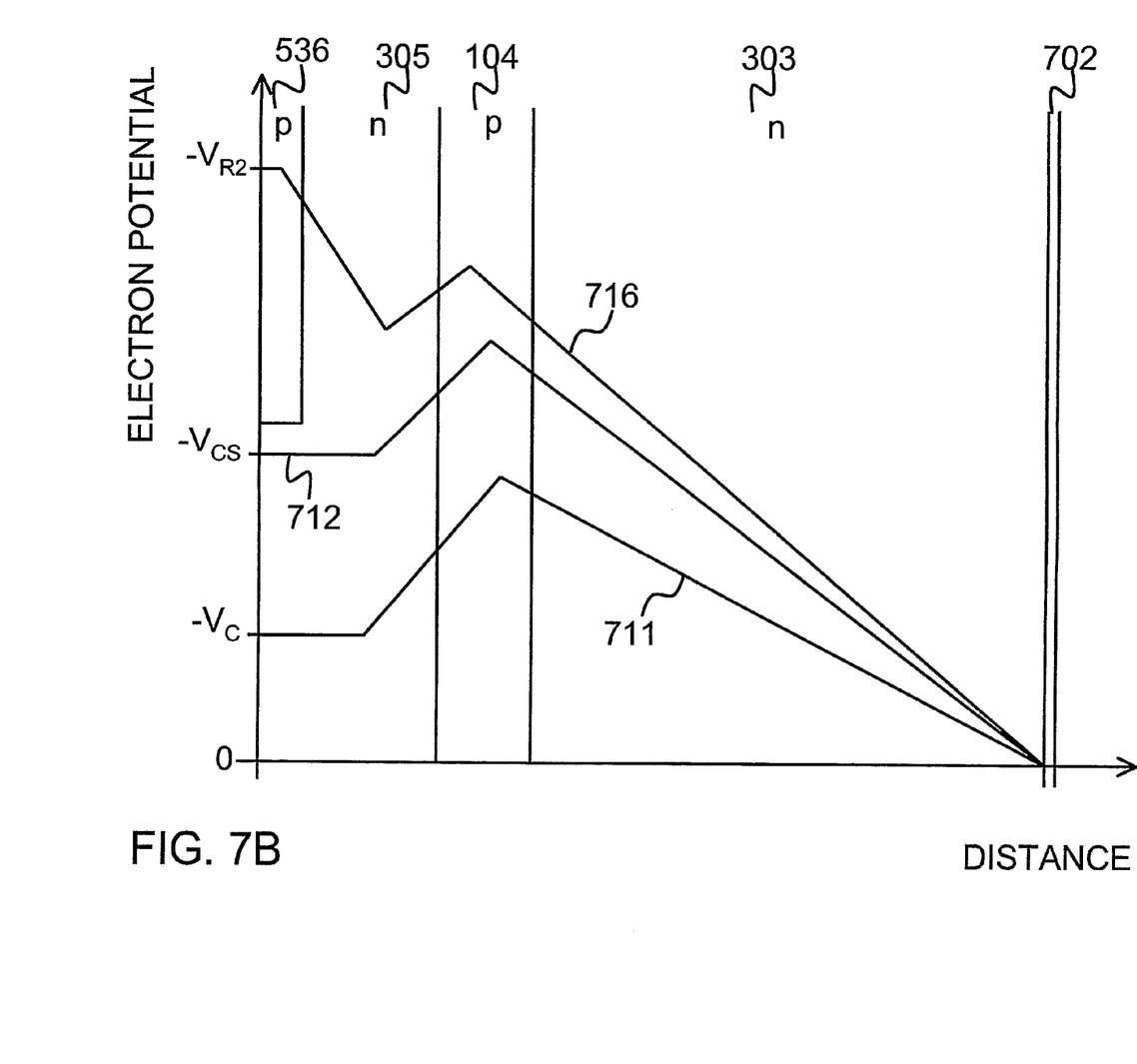
FIG. 7B illustrates electron potentials of the device presented in FIG. 6A during reset.

Electron potential energy curves on the cut lines 681, 682 and 686 are presented in FIGS. 7A and 7B. FIG. 7A corresponds to the signal charge integration period and FIG. 7B corresponds to an occasion during the row reset operation. In FIGS. 7A and 7B the first conductivity type is n type and the second conductivity type is p type. It is important to note that the first conductivity type can also be p type and the second conductivity type n type. On the back side of the device is a conductive layer 702. The electron potential energy curve 716 on the cut line 686 penetrating the separation doping 536 is almost the same than the electron potential energy curves 711 and 712 on the cut lines 681 and 682 penetrating the channel stop dopings during the integration period. The separation doping is connected to an electron potential $-V_{R1}$ and the channel stop dopings to an electron potential $-V_{CS}$ during the signal charge integration period. It is important to note that the channel stops and the separation doping are reverse biased with respect to each others. During the row reset the reverse biasing between the separation doping and the channel stop dopings is first enhanced by connecting the separation doping to an electron potential $-V_{R2}$. After this the reverse biasing between one channel stop doping (621) and the separation doping 536 is enhanced even more by connecting the channel stop doping 621 to a clear potential $-V_C$. As a result the signal charges in the enhancements of the MIG layer dopings 392 will be collected by the source and drain dopings 132, 131 and 133 in the pixels where the channel stop doping is connected to the clear potential. After this the channel stop doping 621 is connected back to electron potential $-V_{CS}$. In the end of the read out period the separation doping is connected back to the electron potential $-V_{R1}$.

Figure 8A:
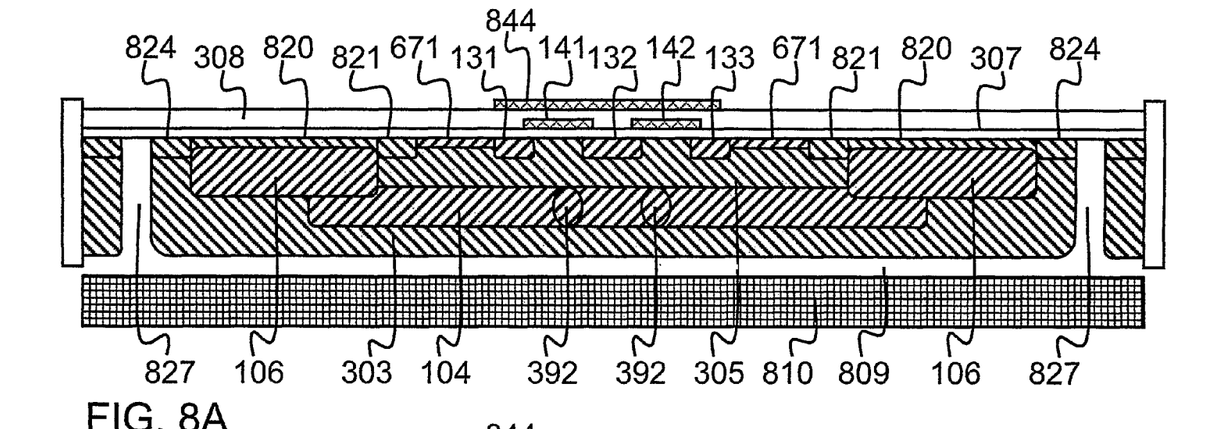
FIG. 8A illustrates an embodiment of the invention where the pixels are isolated completely from each others using SOI technology.
Figure 8B:
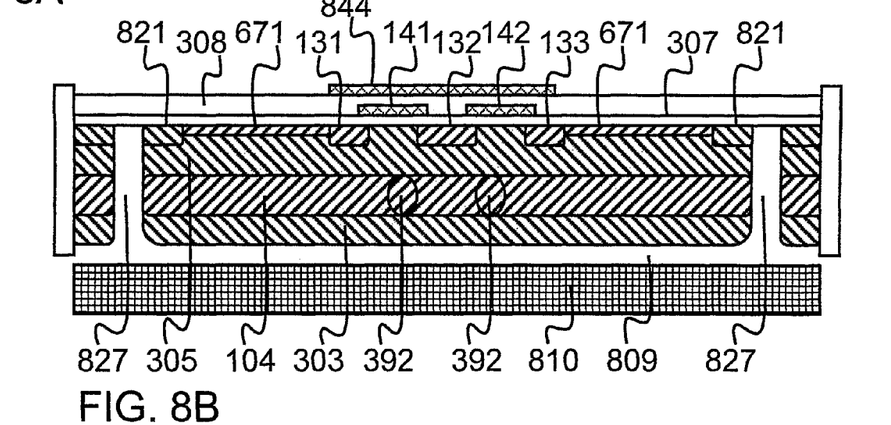
FIG. 8B illustrates another embodiment of the invention where the pixels are isolated completely from each others using SOI technology.
Figure 8C:
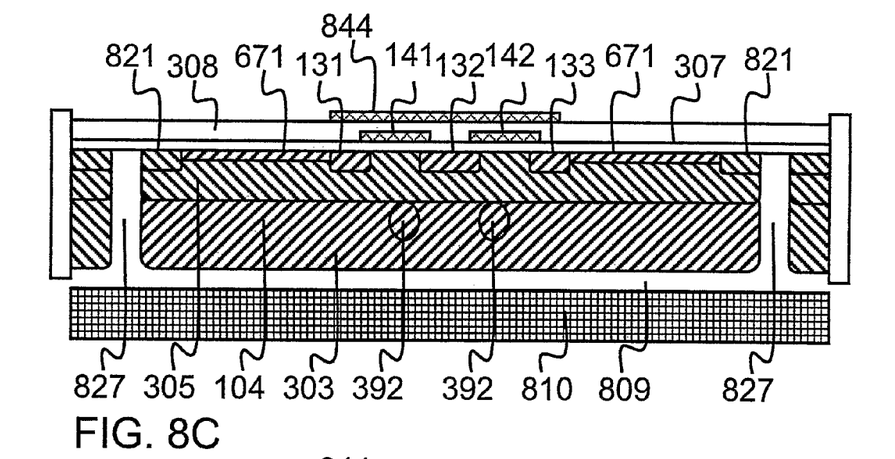
FIG. 8C illustrates yet another embodiment of the invention where the pixels are isolated completely from each others using SOI technology.
Figure 8D:
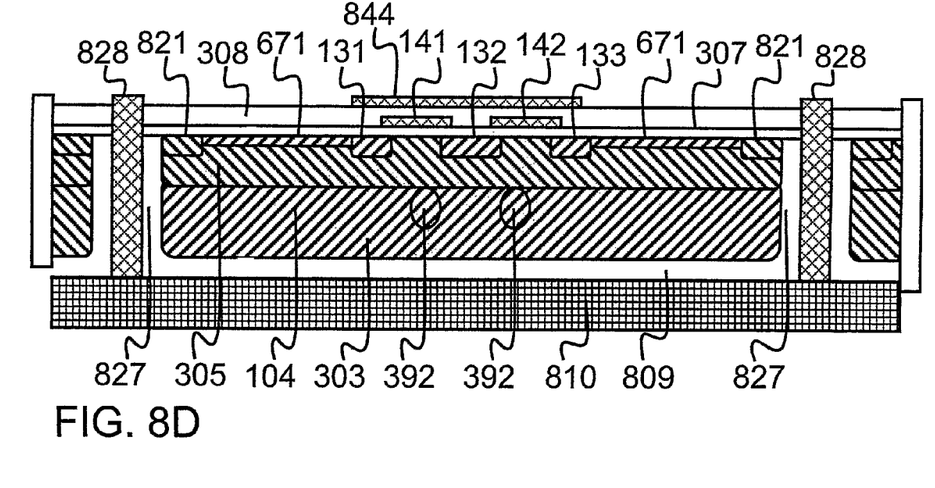
FIG. 8D illustrates still yet another embodiment of the invention where the pixels are isolated completely from each others using SOI technology.

An alternative way to perform row reset in the MIG detector described in WO 2006/018470 A1 and WO 2006/018477 A1 is represented in FIGS. 8A, 8B, 8C and 8D. In the devices of FIGS. 8A-8D the pixels are completely isolated from each others by isolator layers 809 and 827. The devices in FIGS. 8A-8D are made on SOI wafers where a SOI isolator layer 809 is situated between a thick SOI substrate 810 and a thin SOI semiconductor layer. The thin SOI semiconductor layer comprises the bulk layer, the MIG layer, the barrier layer and the pixel dopings. The pixels are isolated from each others by isolator trenches 827. The isolator trenches are processed by etching trenches to the thin SOI semiconductor layer and by filling the trenches with isolator material. In FIG. 8A the channel stop doping 821, the extension of the channel stop doping 820 and an optional doping 824 are all of the first conductivity type. The opaque layer 844 shielding the source from light is preferably added to front illuminated devices. One should note that the devices in FIGS. 8A and 8D can be made back illuminated by etching the thick SOI wafer away. The device in FIG. 8A differs from the device in FIG. 8B in the aspect that the former device has a buried doping 106 and the latter one has not.

In the devices 8C and 8D the bulk layer 303 and the MIG layer 304 are both of second conductivity type. At the interface of the bulk layer 303 and the SOI isolator layer there is a conductive layer described in WO 2006/018470 A1, WO 2006/018477 A1, FI20040996 and WO 2006/005803 A1. Such a conductive layer 702 is drawn in FIGS. 7A and 7B. The conductive layer can for instance be made of a two dimensional (2D) charge gas layer. Such a 2D charge gas layer can be a result of fixed charges in the SOI isolator layer 809 or it can be made by applying a suitable bias to the thick SOI substrate 810. The device of FIG. 8D differs from the device of FIG. 8C in the aspect that a preferably opaque and conducting material 828 like metal is added to the trench isolation structure. This conducting material can be used to bias the thick SOI substrate and to shield the pixels from scattered light.

Figure 9:
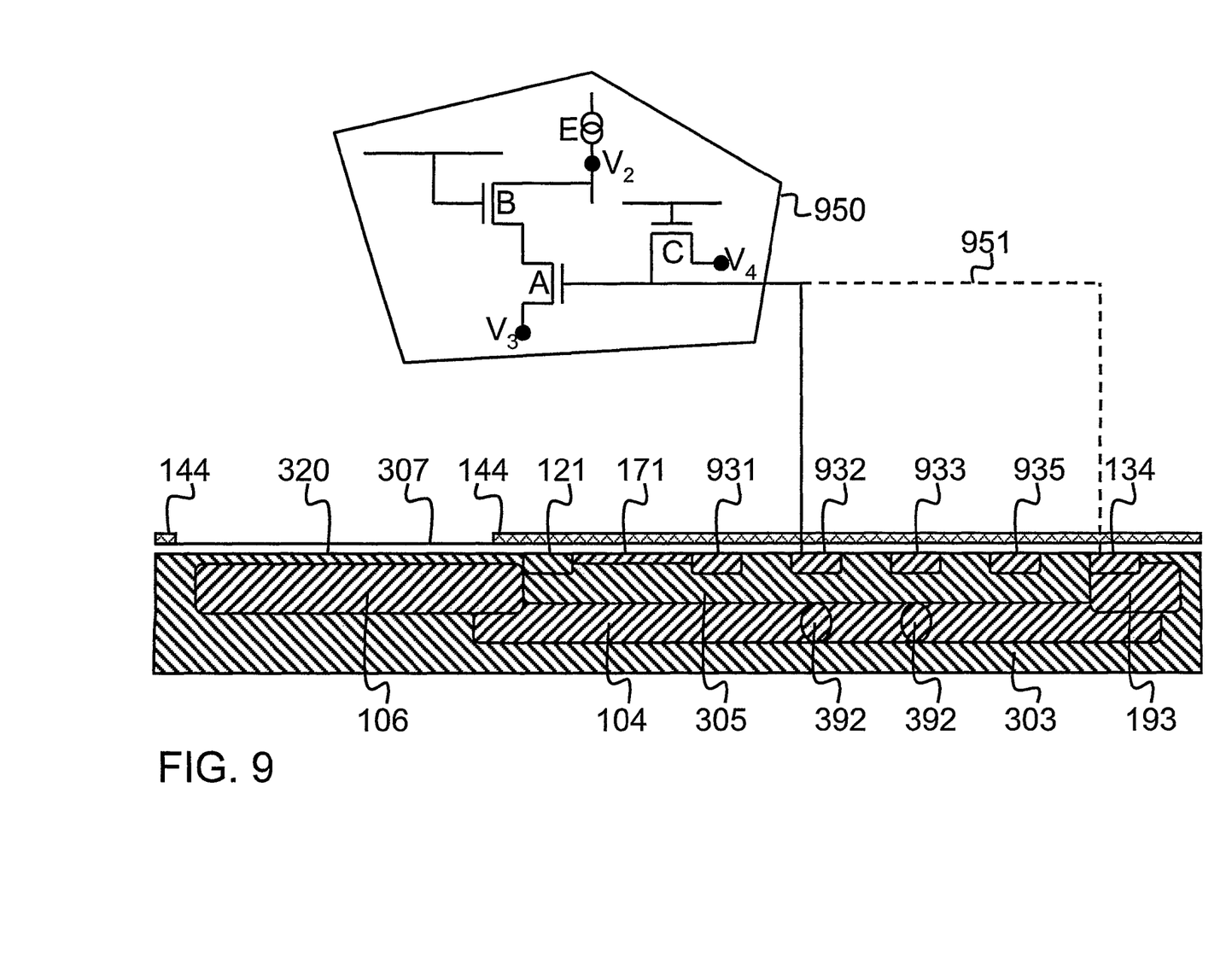
FIG. 9 illustrates a MIG detector where the signal charge is detected using a floating gate arrangement.

FIG. 9 illustrates an embodiment of the invention where the signal charge in the MIG layer 104 is read nondestructively using a floating gate configuration. The floating gate configuration comprises a floating pixel doping 932 of the second conductivity type which is connected to a read out circuitry 950. The read out circuitry 950 can be for instance similar than the additional electronic circuitry 150. The pixel dopings 931 and 933 are used to transfer the signal charge back and forth between the local enhancements of the MIG layer dopings 392 situated below the pixel dopings 932 and 933. The pixel doping 935 is a clear gate and the doping 134 is a clear contact. It is important to note that the clear contact 134 can be optionally connected by a conductor 951 to the read out circuitry 950. In this manner the dynamic range of the detector can be improved Without connecting a second electronic circuitry 150 to the clear contact. The signal charge is first measured by the floating gate configuration and after that the signal charge is transferred to the clear contact where it can be read again. If the measured amount of the signal charge exceeds a certain limit the result of the latter measurement is chosen. If the measured amount of the signal charge does not exceed this limit the result of the former measurement is chosen.

Figure 10A:
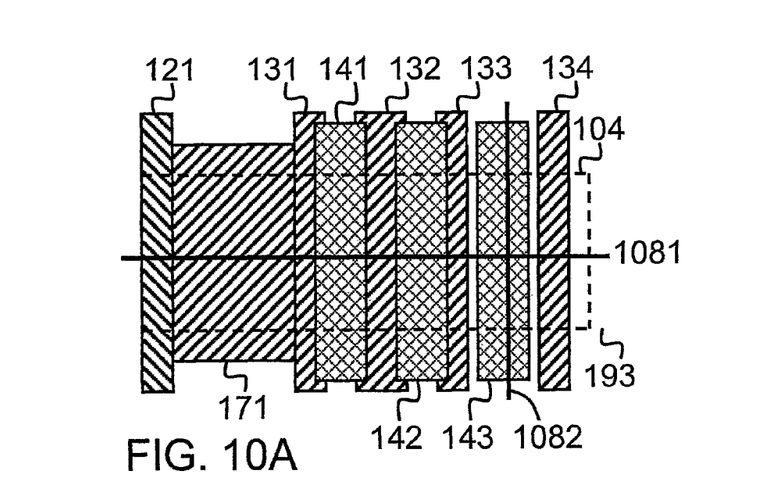
FIG. 10A illustrates a MIG detector having a clear configuration formed of two overlapping dopings.
Figure 10B:
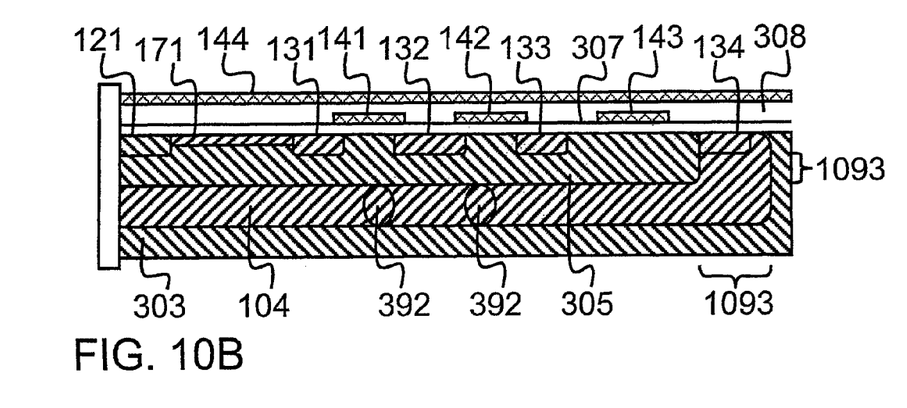
FIG. 10B illustrates a cross-section of the device presented in FIG. 10A.
Figure 10C:
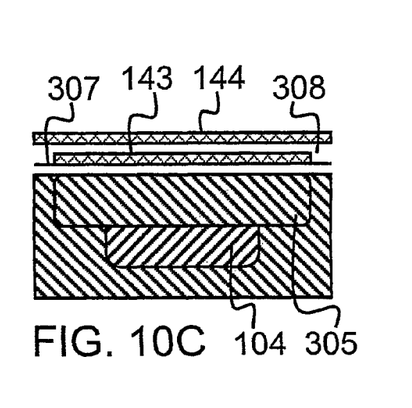
FIG. 10C illustrates a cross-section of the device presented in FIG. 10A.

FIG. 10A describes an embodiment of the invention where the cut lines 1081 and 1082 correspond to the cross-sections presented by FIGS. 10B and 10C. In FIG. 10B the area between the two brackets of the form { is the second type doping 1093 connecting the MIG layer 104 of the second conductivity type and the clear contact 134 of the second conductivity type. In this case the MIG layer 104, the barrier layer 305 and the doping 1093 are formed of two overlapping dopings of the second and the first conductivity type.

Figure 11:
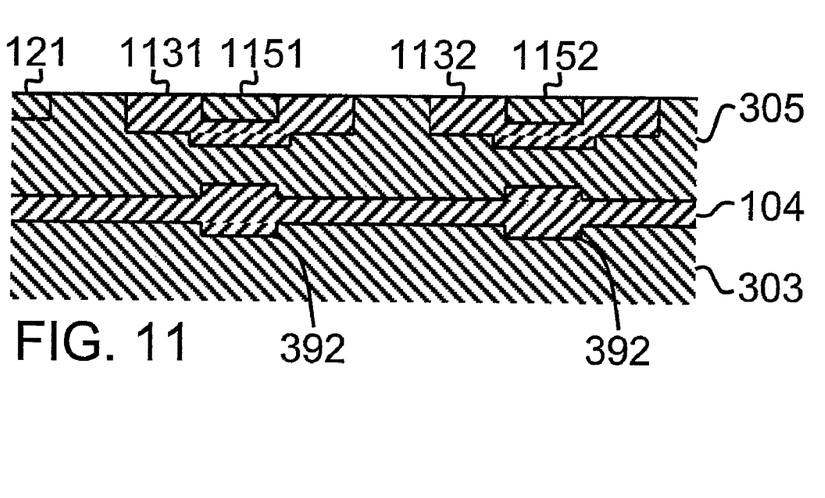
FIG. 11 illustrates a double MIGBJT configuration.

The MOSFET is not the only possible transistor to be used in conjunction with the MIG. In FIG. 11 MOSFETs (Metal Oxide Semiconductor Field Effect Transistor) are replaced by BJTs (Bipolar Junction Transistor) forming a double MIG-BJT. The pixel dopings 1131 and 1132 of the second conductivity type are the base dopings 10, and the dopings 1151 and 1152 of the first conductivity type are the emitter dopings of the MIGBJTs. The channel stop doping 121 of the first conductivity type acts as the collector of the MIGBJTs collecting the charges of the first conductivity type emitted by the emitters. In addition to the three conventional nodes of a BJT there is a fourth node in the MIGBJT, i.e. the MIG.

Figure 12:
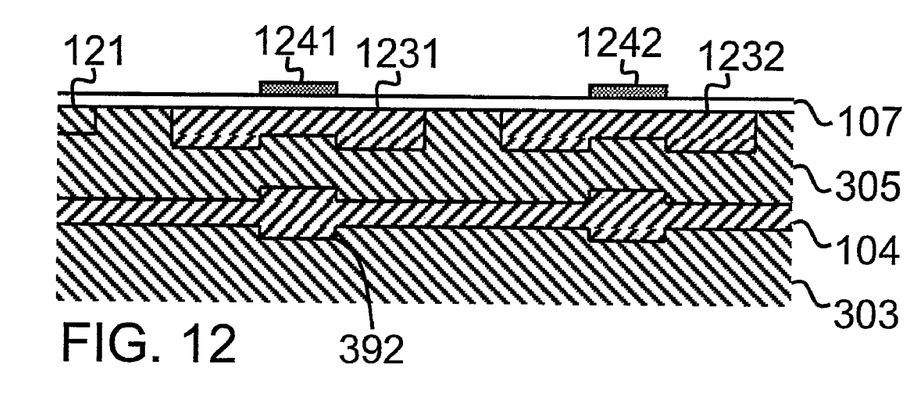
FIG. 12 illustrates an alternative double MIGFET configuration.

In FIG. 20 the MOSFETs are replaced by junction field effect transistors (JFET) where the gate dopings are replaced by MOS gates 1241 and 1242. The pixel dopings 1231 and 1232 act as the source, drain and channel dopings.

Figure 13:
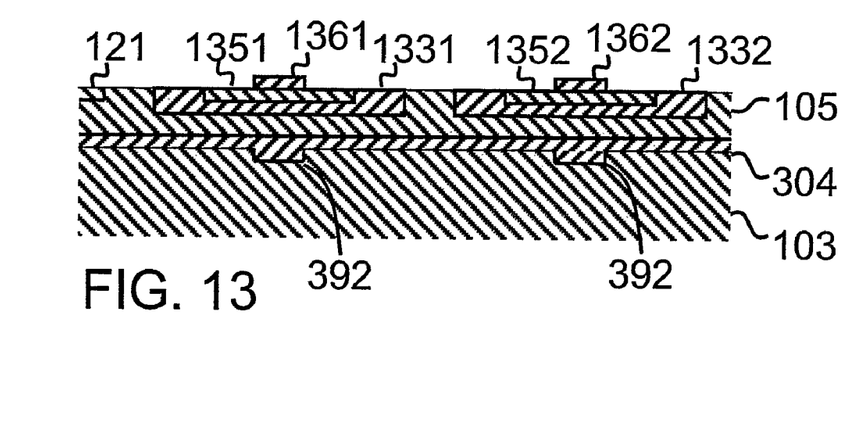
FIG. 13 illustrates an alternative double MIGBJT configuration.
Figure 14:
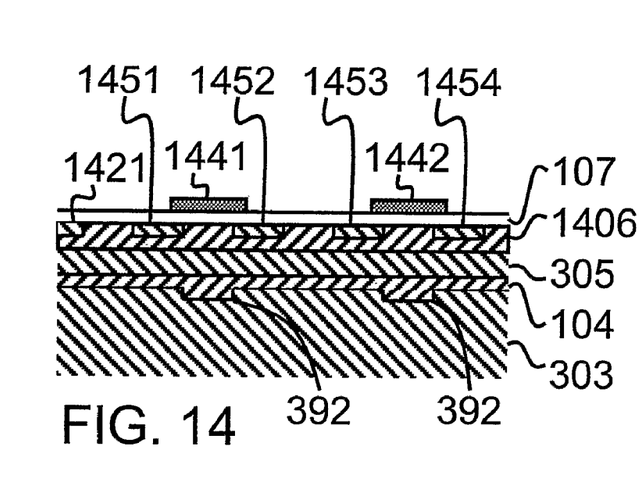
FIG. 14 illustrates an alternative double MIGFET configuration.

In all of the transistors comprising the MIG that have been introduced until now the signal charges in the MIG decreases the effective channel or base width. FIGS. 13 and 14 illustrate transistors comprising the MIG where the signal charges in the MIG increase the effective channel or base width. In FIG. 13 the second conductivity type pixel dopings 1331 and 1332 act as collector dopings and the dopings 1351 and 1352 of the first conductivity type act as base dopings. The emitters 1361 and 1362 of the second conductivity type are formed for instance of polycrystalline semiconductor material like of polycrystalline silicon. In FIG. 14 the pixel doping 1406 is a continuous layer encapsulating the channel stop doping 1421. Inside the pixel doping 1406 of first conductivity type there are also the source and drain dopings 1451, 1452, 1453 and 1454 of two MOSFETs. The conductors 1441 and 1442 are the gates of the two MOSFETs.

It is important to note that in operation a reverse bias is connected between pixel dopings of the second conductivity type and a first conductivity type first contact which can be either the channel stop doping or a contact to the bulk layer. This first contact collects the secondary charges created in the semiconductor detector. It is also important to note that the doped region (193, 1093) between the MIG layer and the clear contact can be replaced by a local reduction of the barrier layer net doping or by a trench just like presented in PCT/FI2006/000009 and PCT/FI2006/000058. The MIGFET gate insulator 307 is preferably thick and it is made of a low k material. The insulator layer 307 can be for instance made by first growing a layer of 10 nm of silicon dioxide on top which is deposited a 190 nm thick layer of low k isolator material.

It should also be noted that the dynamic range of the MIG detector can be improved by observing an image with several different integration times. As an example one can first use an integration time of 40 ms after which the signal charge is measured and reset. Next one can observe the image with 4 ms and 0.4 ms integration times. In this manner the dynamic range is improved by 100 times. The signal charge is preferably measured multiple times after the first integration time but only one time after the second and third integration time. The problem of this approach is, however, that the images of fast moving objects are blurred. One can also multiply the signal charges while the signal charges are transferred back and forth between the local enhancements of MIG layer dopings in a double MIG detector by the impact ionization process. This requires, however, that high enough voltages are applied to the MIG detector.

One can use instead of the double transistor pixels single transistor or multiple transistor pixels. Instead of the MOSFET, JFET and the BJT one can use any unipolar or bipolar transistor in the pixels. The source of a FET or the emitter of a bipolar transistor may be floating and it may be connected to a capacitor. The pixels may be surrounded by preferably ring shaped guard structures which are formed of MOS structures or of dopings in order to increase the pixel area. The dopings of the invention may also be tailored in any possible way using implants having different masks, different energies, different doses, different angles and different conductivity types. In some cases the dopings may also be replaced with suitable metal contacts, i.e. with Ohmic or Schottky type contacts. The semiconductor material is preferably silicon but any other semiconductor material may be used. The semiconductor material could for example be Germanium. The contact openings through the isolator layer 1307 and the contacts to the different dopings are not shown. The MIG detector can be front or back illuminated. One can use anti reflection coatings, scintillator coatings, colour filters or micro lenses in both front and back illuminated MIG detectors.

There may also be read and selection electronics on the detector chip. A device that includes a detector according to an embodiment of the invention may also include other semiconductor chips, some of which may have bonded connections to the pixels of the detector. This enables building very compact structures that include detection, amplification, reading and in some cases even storage in a very small space, like an MCM (multi-chip module).

The invention claimed is:
1. A semiconductor radiation detector device, comprising:
a bulk layer of semiconductor material, and on the first surface of the bulk layer in the following order:
  a modified internal gate layer of semiconductor material of second conductivity type, said modified internal gate layer being configured to store signal charges induced in said bulk layer,
  a barrier layer of semiconductor material of first conductivity type,
  pixel dopings of semiconductor material of the second conductivity type, adapted to be coupled to at least one pixel voltage in order to create pixels corresponding to pixel dopings, wherein said barrier layer is configured to separate signal charges stored in said modified internal gate layer from charges in said pixel dopings,
a first contact of the first conductivity type, wherein said pixel voltage is defined as a potential difference between the pixel doping and the first contact, and
means for reading signal charge from said modified internal gate layer using a floating gate configuration, in which a gate of a readout transistor floats in respect of said pixel voltage.

2. A semiconductor radiation detector device according to claim 1, wherein said first contact comprises channel stop dopings between pixels.

3. A semiconductor radiation detector device according to claim 1, comprising a clear contact.

4. A semiconductor radiation detector device according to claim 3, comprising a doped region of the second conductivity type between the modified internal gate layer and the clear contact.

5. A semiconductor radiation detector device according to claim 3, comprising a local reduction of the barrier layer net doping between the modified internal gate layer and the clear contact or wherein there is a trench between the modified internal gate layer and the clear contact.

6. A semiconductor radiation detector device according to claim 3, comprising a gate configured to control a flow of signal charges from the modified internal gate layer to the clear contact.

7. A semiconductor radiation detector device according to claim 3, comprising two gates controlling a flow of signal charges from the modified internal gate layer to the clear contact.

8. A semiconductor radiation detector device according to claim 3, comprising additional electronic circuitry connected to the clear contact.

9. A semiconductor radiation detector device according to claim 7, wherein the additional electronic circuitry is configured to measure the amount of signal charges collected by the clear contact.

10. A semiconductor radiation detector device according to claim 1, comprising channel stop dopings separated by a separation doping.

11. A semiconductor radiation detector device according to claim 10, wherein the separation doping isolates the channel stop dopings during reset enabling thus row reset.

12. A semiconductor radiation detector device according to claim 1, wherein pixels are completely isolated by isolator material.

13. A semiconductor radiation detector device according to claim 12, comprising opaque material or conducting material or opaque and conducting material inside a trench.

14. A semiconductor radiation detector device according to claim 1, configured to have the signal charge read using floating gate configuration comprising a pixel doping that is connected to a read out circuitry.

15. A semiconductor radiation detector device, comprising:
a bulk layer of semiconductor material, and on the first surface of the bulk layer in the following order:
a modified internal gate layer of semiconductor material of second conductivity type,
a barrier layer of semiconductor material of first conductivity type,
pixel dopings of semiconductor material of the second conductivity type, adapted to be coupled to at least one pixel voltage in order to create pixels corresponding to pixel dopings;
a first contact, said pixel voltage is defined as a potential difference between the pixel doping and the first contact,
means for reading signal charge from said modified internal gate layer using a floating gate configuration, in which a gate of a readout transistor floats in respect of said pixel voltage, and
a first global shutter gate and a second global shutter gate the first global shutter gate controlling a flow of signal charges to the MIG detector and the second global shutter gate controlling the flow of signal charges to a clear contact.

16. A semiconductor radiation detector device according to claim 15, configured to have the first global shutter gate open and the second global shutter gate closed during a signal charge integration period and the first global shutter gate closed and the second global shutter gate open during a signal charge read out period.

* * * * *